(12) United States Patent
Hinks et al.

(10) Patent No.: US 6,983,181 B2
(45) Date of Patent: Jan. 3, 2006

(54) SPATIAL ENCODING MR DATA OF A MOVING SUBJECT USING A HIGHER-ORDER GRADIENT FIELD

(75) Inventors: Richard Scott Hinks, Waukesha, WI (US); Kevin F. King, New Berlin, WI (US); Jason A. Polzin, Lake Mills, WI (US)

(73) Assignee: General Electric Company, Schenectady, NY (US)

( * ) Notice: Subject to any disclaimer, the term of this patent is extended or adjusted under 35 U.S.C. 154(b) by 155 days.

(21) Appl. No.: 10/063,507

(22) Filed: May 1, 2002

(65) Prior Publication Data

US 2003/0206012 A1 Nov. 6, 2003

(51) Int. Cl.
*A61B 5/55* (2006.01)

(52) U.S. Cl. ...................................... 600/410; 324/309

(58) Field of Classification Search ................ 600/410, 600/407, 415; 324/309, 318, 322, 307
See application file for complete search history.

(56) References Cited

U.S. PATENT DOCUMENTS

| 4,665,365 | A | * | 5/1987 | Glover et al. ................ 324/309 |
| 4,770,182 | A | * | 9/1988 | Damadian et al. ........... 600/410 |
| 4,881,032 | A | * | 11/1989 | Bottomley et al. .......... 324/309 |
| 5,122,748 | A | * | 6/1992 | Oh et al. ...................... 324/309 |
| 6,011,392 | A | * | 1/2000 | Zhou et al. .................. 324/309 |
| 2002/0140423 | A1 | * | 10/2002 | Brittain ........................ 324/301 |
| 2002/0147395 | A1 | * | 10/2002 | Heid ............................ 600/410 |
| 2002/0173715 | A1 | * | 11/2002 | Kruger et al. ............... 600/410 |
| 2004/0140804 | A1 | * | 7/2004 | Polzin ........................ 324/309 |

\* cited by examiner

*Primary Examiner*—Ruth S. Smith
(74) *Attorney, Agent, or Firm*—Ziolkowski Patent Solutions Group, SC; Michael A. Della Penna; Carl B. Horton

(57) ABSTRACT

The present invention includes a technique for use with magnetic resonance imaging that includes the application of a non-linear, higher-order gradient field in the presence of a moving object to be scanned. MR data is acquired as the object moves through the non-linear gradient field. Resulting images are contiguous and do not require the patching together of data in either k-space or image space and result in an image with expanded FOV in a longitudinal direction of the moving object.

23 Claims, 4 Drawing Sheets

SPATIAL ENCODING MR DATA OF A MOVING SUBJECT USING A HIGHER-ORDER GRADIENT FIELD

BACKGROUND OF INVENTION

The present invention relates generally to magnetic resonance imaging (MRI), and more particularly, to a method and apparatus that employs a higher-order gradient field to achieve spatial encoding of a moving object.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, spatially linear magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Typically, these linear magnetic field gradients are used to achieve spatial encoding in MR imaging. For example, a conventional linear Z gradient can be used as a phase encoding gradient in which spatial encoding is achieved by stepping the phase encoding gradient through all the required k-space values while the object remains stationary. However, such systems are limited to the field of view (FOV) of the magnet, or if a moving table is employed, steps must be taken to offset the effects of movement. It would be desirable to image the longitudinal axis of a patient without the need of an oversized magnet. Such large Z-direction FOVs may be acquired by moving the patient while scanning, then combining data either during or after image reconstruction.

Prior art methods used to acquire longitudinally extended FOV images typically use the conventional linear magnetic field gradients $G_x$, $G_y$, and $G_z$ which are modified to offset the effects of patient movement. That is, such prior art methods that rely on encoding using the linear gradients, must either piece together raw data to reconstruct an image or piece together multiple reconstructed "sub-images."

It would therefore be desirable to have a method and apparatus capable of scanning an object continuously while it moves through the magnet without the need to patch data together in k-space or in image space.

BRIEF DESCRIPTION OF INVENTION

The present invention provides a method and apparatus that is capable of acquiring spatially encoded MR data using a high-order gradient field to acquire data as an object passes through the gradient field that overcomes the aforementioned problems. The invention also includes a pulse sequence for use with MR image acquisition to accomplish the foregoing.

The present invention includes an encoding technique that combines intentional object motion with a higher-order gradient field to achieve spatial encoding. Using a quadratic gradient field, such as a $Z^2$ gradient field, at any given Z-location, the local gradient is approximately a linear gradient and therefore the value of this gradient is a linear function of the Z-location. By moving the object in the Z-direction on successive pulse sequence repetitions, a full range of effective $k_z$ data can be collected. A quadratic phase correction along $k_z$ followed by Fourier transformation yields a resulting image that does not require patching in either k-space or image space.

A method of acquiring spatially encoded MR data is disclosed that includes applying a gradient field having an exponential relation higher than a single order along an object direction. The method includes moving an object to be scanned in the object direction through the gradient field, and acquiring MR data as the object moves with contiguous continuity in the object direction.

The pulse sequence disclosed includes a series of RF pulses, wherein each RF pulse occurs within a defined repetition time period. The pulse sequence also includes a non-linear phase encoding gradient. The gradient is comprised of a higher-order gradient having a consistent value applied in each repetition of the pulse sequence.

In accordance with another aspect of the invention, an MRI apparatus is disclosed to acquire continuous imaging of a moving object over an extended FOV. The MRI apparatus has a magnetic resonance imaging system having a plurality of gradient coils positioned about a bore of a magnet to impress a polarizing magnetic field. An RF transceiver system and an RF switch is controlled by a pulse module to transmit and receive RF signals to and from an RF coil assembly to acquire MR images. At least one of the gradient coils is constructed to impart a higher-order gradient field. The MRI apparatus also includes a table movable along a longitudinal axis into and out of the bore of the magnet. The at least one higher-order gradient coil is constructed so as to produce a non-linear gradient field along the direction of the longitudinal axis of the movable table. The MRI apparatus also includes a computer programmed to transmit a series of RF pulses and apply a higher-order gradient field between each RF pulse in a series of RF pulses. The computer is also programmed to move the table and acquire data in the presence of the spatially encoding higher-order gradient field.

In accordance with yet another aspect of the invention, a method of acquiring MR images with expanded FOV in a longitudinal direction of a moving object includes defining a direction of motion of the object to be scanned and arranging the object such that the longitudinal axis is positioned along the direction of motion. The method also includes applying a non-linear gradient field in the direction of motion and moving the object through the applied non-linear gradient and acquiring k-space data with spatial encoding in the direction of motion.

The invention also includes a computer program having instructions which, when executed by a computer, cause the computer to initiate transmission of an RF signal toward an imaging object, energize a higher-order gradient coil, and acquire MR data either with continuous movement of the imaging object or with step-wise movement of the imaging object. The aforementioned acts are repeated until sufficient MR data is acquired along a desired length of the image object that is coincident with a direction of motion. A contiguous image can then be constructed of the desired length of object.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
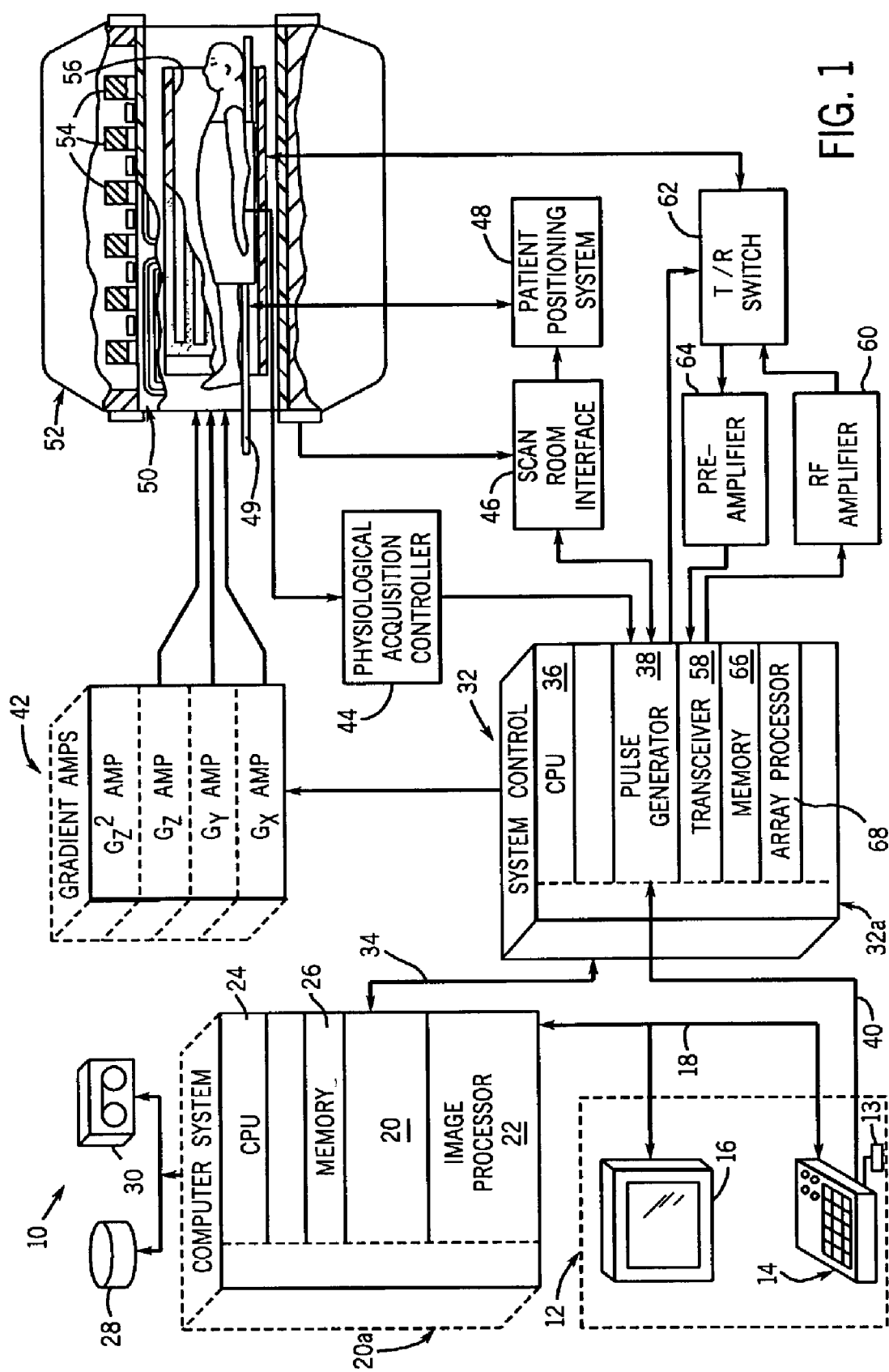
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. The pulse generator module 38 is connected to a scan room interface circuit 46 which receives signals from various sensors associated with the condition of the patient and the magnet system. A patient positioning system 48 receives commands from the scan room interface circuit 46 to move the patient on table 49 to the desired position(s) for the scan. The patient table 49 is preferably automatically moveable along a longitudinal axis into and out of the scanner coincident with the length of a patient. The table 49 may be moved continuously or in steps.

The gradient waveforms produced by the pulse generator module 38 are applied to the gradient amplifier system 42 having Gx, Gy, Gz, and Gz2 amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display screen 16.

In accordance with the present invention, the above-described apparatus includes at least one gradient coil that is constructed to impart a higher-order gradient field $G_{z2}$. This higher-order gradient coil is designed to produce a non-linear gradient field along the direction of the longitudinal axis of the moveable table 49. The present invention includes a method, apparatus, system, and technique suitable for use with the above-referenced NMR system, or any similar or equivalent system for obtaining MR images. Unlike prior methods that encode in spite of motion, or must compensate for motion, the present technique benefits from use of the motion. The present technique provides continuous or seamless acquisition of raw data and therefore provides the capability of reconstructing continuous or seamless images.

Figure 2:
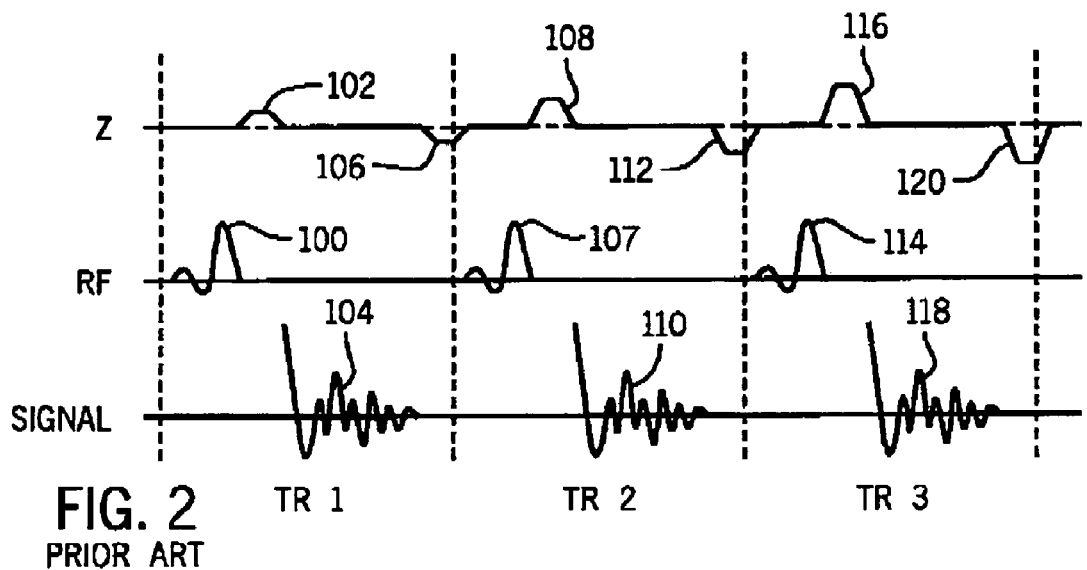
FIG. 2 is a timing block diagram of a prior art pulse sequence.

Referring now to FIG. 2, a typical, conventional pulse sequence is shown for use in phase encoding on the Z-axis. After transmission of an RF signal 100, a first linear Z-phase encoding gradient 102 is applied and data can be acquired 104 in a first repetition time TR1. Optionally, and preferably, a rewinder gradient 106 having equal amplitude as that of the Z-encoding gradient 102 is applied before the next RF pulse 106. In such prior art phase encoding techniques, the linear Z gradient is incremented from view to view or, in each TR. As shown in FIG. 2, the linear phase encoding gradient 108 is incremented from the previous Z-phase encoding gradient 102 and is followed by another data acquisition 110. After application of an incremented rewinder 112, the sequence is repeated with another RF pulse 114 and another linear Z-phase encoding gradient 116 having another increment followed by data acquisition 118 and an equivalently implemented rewinder 120. Such conventional linear Z-gradient phase encoding is achieved by stepping the phase encoding gradient through all the required k-space values while the object remains stationary. In this prior art technique, a linear Z-gradient pulse is applied at a different value for each TR. Therefore, no motion is required to achieve spatial encoding in the Z axis. As a result, if motion is present as in moving table MRI, the prior art technique must modify the linear encoding to take into account the motion and either piece together raw data or reconstructed images to acquire a continuous image.

Assuming for the sake of simplicity, that the direction of object motion is in the Z-direction, the present invention modifies the prior art techniques of achieving spatial encoding in the Z-direction by implementing a higher-order gradient, such as a $Z^2$ gradient field. The higher-order gradient is applied in the direction of motion to achieve spatial encoding of the moving object. As used herein, higher-order refers to any gradient field having an exponential relation higher than a single order, such as a $Z^2$-gradient field. The necessary variations in the k-space encodings are achieved as the object is moved in the Z-direction, or along the direction that the higher-order gradient field is applied. In other words, on each successive excitation of the object, the object will experience a different amount of Z-direction gradient field resulting from the motion of the object through the non-linear field.

Figure 3:
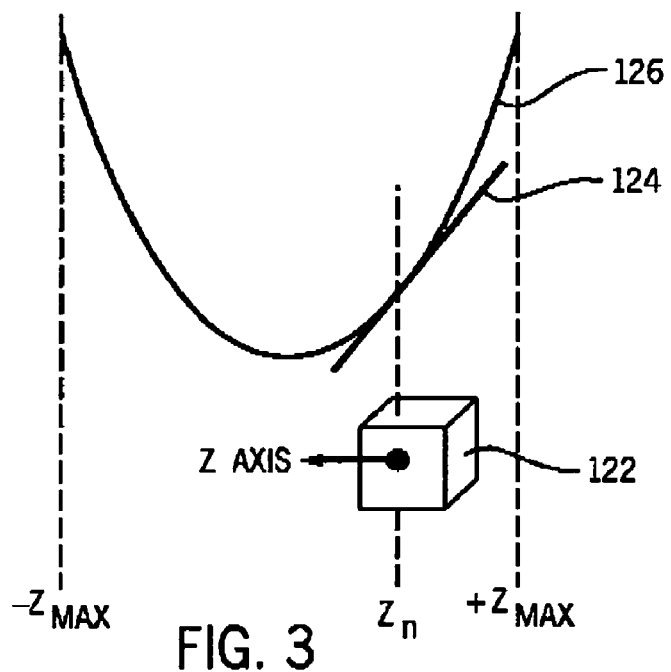
FIGS. 3 and 4 are graphical representations of a moving object in a non-linear gradient field in accordance with the present invention.

For example, as shown in FIG. 3, a moving object 122, at a first given location $Z_n$, has an effective gradient field 124 that is approximately linear with gradient strength proportional to that Z-location on the non-linear gradient field 126. Thus, the effective linear gradient varies as a function of spatial location. As a portion of the object passes from the maximum +Z location to the maximum Z location, the object experiences the full range of $+G_z$ to $G_z$ gradient strength. The necessary Z-direction k-space data is imparted to the object to achieve spatial localization in the Z-direction by keeping the strength of the higher-order gradient constant but varying the location of the object in the Z-direction.

Figure 4:
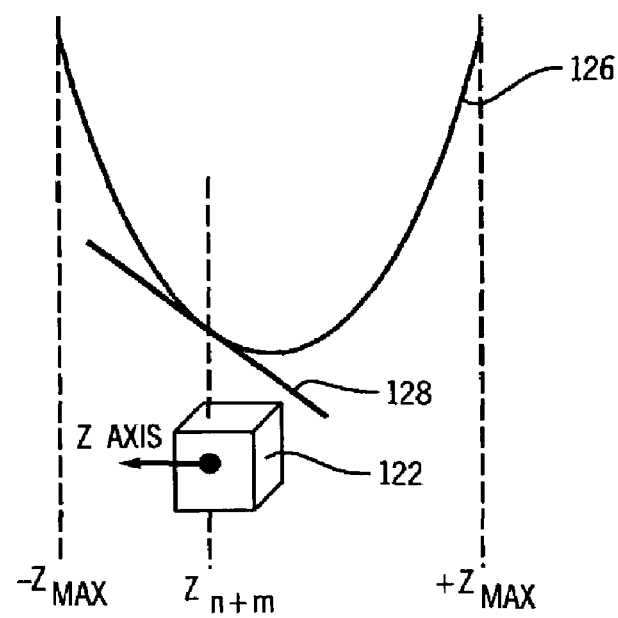

Referring now to FIG. 4, object 122 has moved a distance m to Z location $Z_{n+m}$. The effective, or apparent linear gradient 128 at location $Z_{n+m}$ is still approximately linear along the non-linear gradient 126 but has different value, or gradient strength. In this case therefore, the gradient field has a spatial dependence proportional to $Z^2$ and the "apparent" linear gradient varies as a function of spatial location. As one skilled in the art will readily recognize, the two locations depicted in FIGS. 3 and 4 are not representative of successive TRs but are separated by many TRs as the object is moved across the distance separating the two locations. The present technique therefore replaces the traditional Z-direction k-space encoding scheme that is achieved using either a Z-direction readout gradient or a stepped Z-direction phase encoding. The present technique includes a single $Z^2$ gradient pulse that results in full $k_z$ coverage while allowing the in-plane (X and Y) spatial encoding to be achieved by conventional means such as 2D-FT, spiral, or other projection methods.

Figure 5:
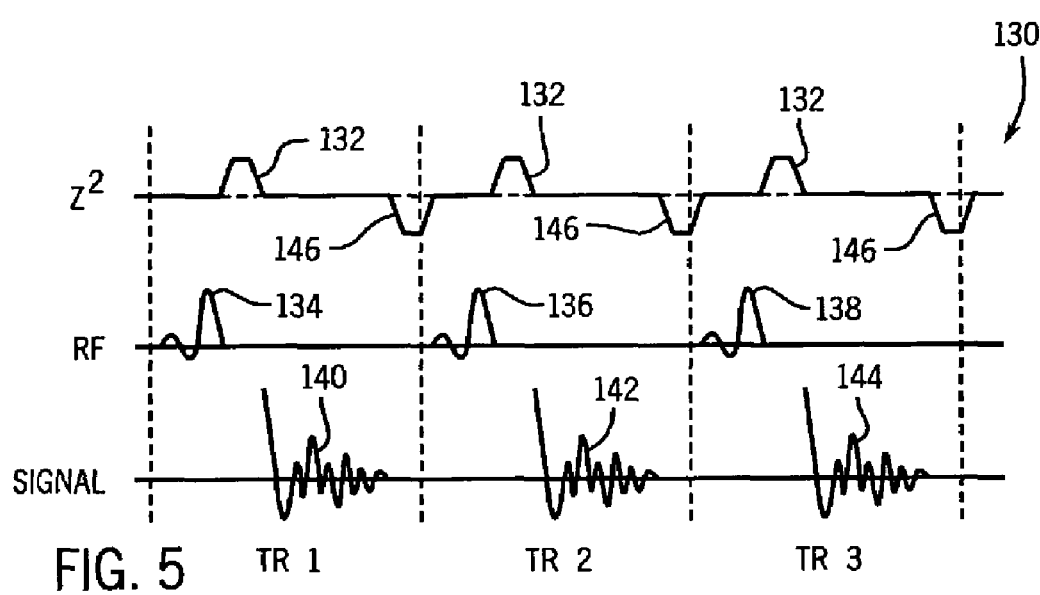
FIG. 5 is a timing diagram of a prior art pulse sequence to accomplish the effects as shown in FIGS. 3 and 4 in accordance with the present invention.

Referring to FIG. 5, a pulse sequence 130 that incorporates this technique of motion-induced spatial encoding includes a higher-order encoding pulse 132 applied at the same value for each TR following RF pulses 134, 136, 138, etc. After the same valued quadratic encoding gradient 132 is applied in each TR, data is acquired at 140, 142, 144 . . . Optionally, a rewinder gradient 146, of similar strength, is applied to rephase spins prior to the next RF pulse in the next TR. The exact value of object movement is calculated to give the correct increment in the $k_z$ encoding scheme based on the quadratic relationship of the non-linear field. It is noted that the object may be moved continuously or stepwise.

Figure 6:
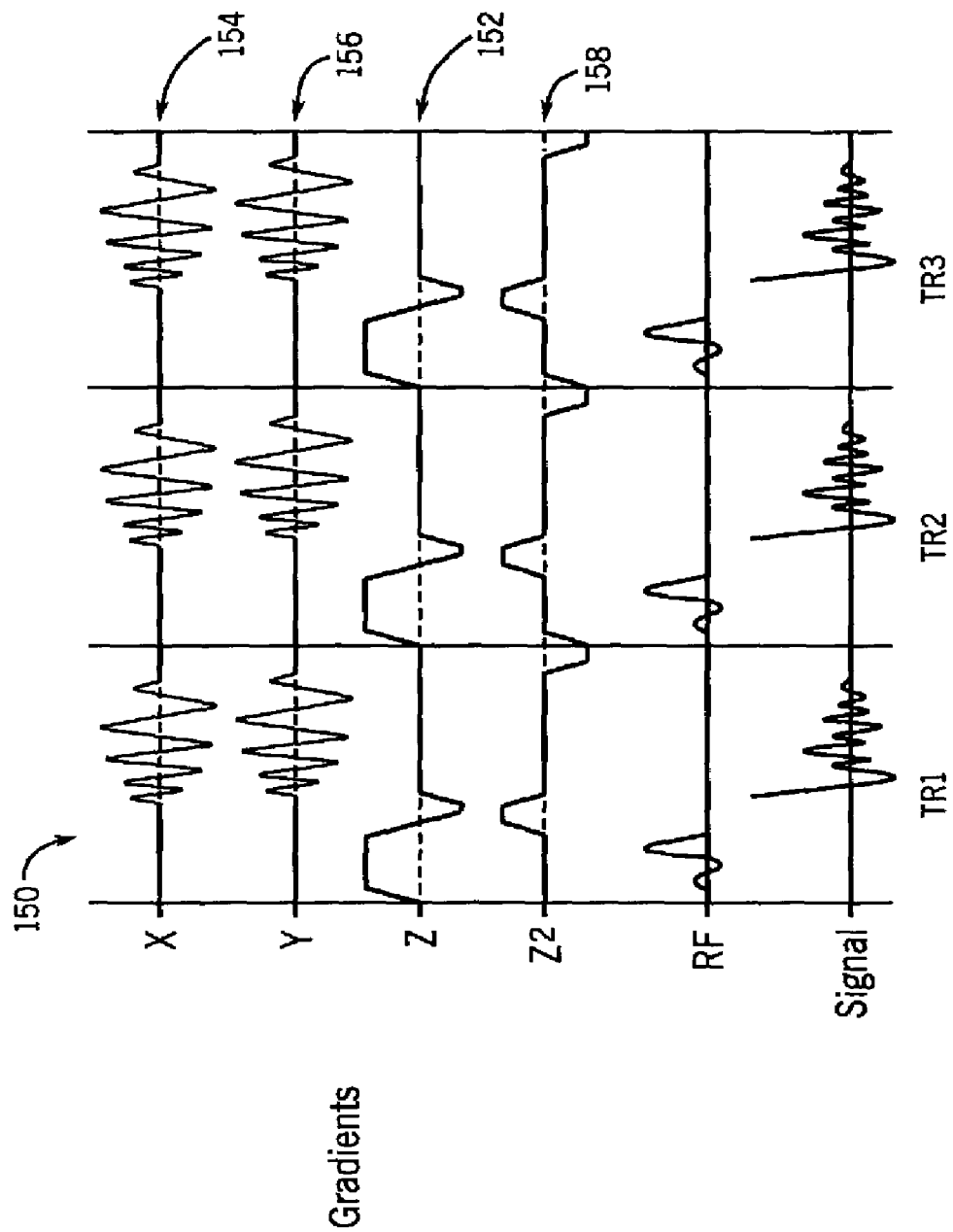
FIG. 6 is a timing diagram of another embodiment of a pulse sequence in accordance with the present invention.

Other spatial encoding pulse sequences are possible and deemed within the scope of the present invention. Some such other pulse sequences could incorporate spatial encoding also in the X and/or Y directions. FIG. 6 illustrates one such pulse sequence 150 in which a spiral-type acquisition is used for in-plane (X and Y) encoding 152, 154, 156 of the moving object while the $Z^2$ gradient is used for through-plane encoding 158. During TR1 the object is at location Z1 and in-plane encoding 152 is applied with a first spiral excitation 154, 156. For TR2, the object is moved in amount $\Delta Z$ and the phase of the spiral excitation is advanced. The number of spiral interleaves is set equal to or less than the number of motion increments $\Delta Z$ that represent one effective $K_z$ encoding distance. This is based on the object location and the change in the effective gradient Z and motion in the higher-order gradient $Z^2$. As previously indicated, the higher-order gradient is applied with consistently equal strength as the object passes therethrough. Because of the $Z^2$ gradient shape, an additional $B_o$ phase shift may be observed as the object is moved in the Z-direction. This phase shift may be compensated for with a corresponding view-dependent phase shift during image reconstruction. Moving the object through the whole range of the $Z^2$ gradient results in a complete 3D data set that can then be reconstructed to generate a complete 3D image.

The present method allows for continuous imaging of an object having a length independent of the fixed field of view of the MR system without retrospectively stitching the image together from multiple sub-images or patching k-space data. Further, the method provides time-efficient acquisition of complete 3D imaging and enables rapid, high resolution whole body scanning using rapid gradient recalled methods, such as a modified FIESTA (SSFP) sequence. Alternatively, the technique includes the acquisition of 1D or 2D images using well known line or slice selection methods.

Therefore, the invention includes a method of acquiring spatially encoded MR data that includes applying a gradient field having an exponential relation higher than a single order along an object direction and moving an object to be scanned in the object direction through the gradient field. The method also includes acquiring MR data as the object moves with contiguous continuity in the object direction.

Preferably the aforementioned gradient field is applied in a Z-direction and the encoding gradient has a constant value such that at any give Z-location, a value of the gradient field is a linear function of the given Z-location. The object is preferably moved in a Z-direction on successive TRs to acquire a full range of $k_z$. After phase correcting acquired MR data along the object direction, and Fourier transforming the phase corrected MR data, images can be reconstructed with spatial encoding in the object direction that are continuous images across an extended FOV. As previously mentioned, the invention includes an MR pulse sequence that includes at least one series of RF pulses, each defining a repetition time period TR and a phase encoding gradient comprised of a higher-order gradient applied with a consistent value during each TR.

Preferably, the pulse sequence includes a rewinder gradient positioned at an end of each TR and having a consistent value from one TR to a next TR to rephase spins prior to a following RF pulse. The pulse sequence may be applied in an MR apparatus having a moving table incremented a value based on the TR of the pulse sequence in order to acquire data with motion-induced spatial encoding.

The invention also includes an MRI apparatus to acquire continuous imaging of a moving object over an extended FOV that includes an MRI system, as previously mentioned, wherein at least one of the gradient coils is a higher-order gradient coil. Preferably, the higher-order gradient coil is in addition to the conventional X, Y, and Z linear gradient coils, but it may also be in place of one of the conventional coils. A movable table is provided to transport an imaging object along a longitudinal axis into and out of the bore of the magnet. A computer is programmed to transmit a series of RF pulses and apply a higher-order gradient field between each RF pulse in the series of RF pulses. The computer is also programmed to move the table and acquire data in accordance with the present invention.

An exemplary unshielded $Z^2$ gradient coil has been designed using a Biot-Savart simulation code written in a simulation package to determine discrete wire locations on a single layer cylindrical former. An example of such a simulation package that can incorporate Biot-Savart simulation code is MATLAB® available from MathWorks, Inc., Natick, Mass. The coil was constructed on a 36" long and 14" diameter PVC cylindrical former by winding enameled #4 wire in machined grooves and then potting and overwrapping the coil with fiberglass and epoxy. The resulting $Z^2$ field map was measured using phase maps of a phantom with different levels of DC current applied to the coil. A moving platform was constructed to fit inside the $Z^2$ gradient coil using a variable speed DC motor to move the platform. Imaging experiments were performed using a 1.5T GE Lx clinical scanner from GE Medical Systems. Milwaukee, Wis. with a body coil transmit and receive configuration. Satisfactory images of a 10 cm. spherical phantom were acquired in the clonal plane with Z-axis phase encoding using a modified gradient echo pulse sequence that maintains constant phase encoding for all $k_z$ views. Images were reconstructed after adding a quadratic phase correction in the phase encoding direction followed by a 2D Fourier transform. Alternatively, it is possible to reconstruct the images using online scanner software. This requires a pulse sequence modification so that a phase modulation proportional to the square of the phase-encoding step number is applied. The resulting images may have a quadratic phase which can be removed by taking the magnitude.

This non-linear experimental coil had an inductance of 133 µH and resistance of 0.057 Ω at 10 kHz. Because of the low inductance, the coil was connected in series with a 1 mH inductive load to match the requirements of the gradient amplifiers.

The invention includes a method of acquiring MR images with expanded FOV in a longitudinal direction of an object that includes defining a direction of motion of the object to be scanned and arranging the object such that a longitudinal axis is positioned along the direction of motion. The process includes applying a non-linear gradient field in the direction of motion and moving the object through the applied non-linear gradient. K-space data can therefore be acquired with spatial encoding in the direction of motion.

The invention also includes a computer program that includes a set of instructions which, when executed by a computer, causes the computer to initiate transmission of an RF signal toward an imaging object, energize a higher-order gradient coil, acquire MR data, and move the imaging object. The aforementioned acts are repeated until sufficient MR data is acquired along a desired length of the imaging object that is coincident with the direction of motion. A continuous image is then reconstructed of the desired length of the object.

Preferably, the higher-order gradient coil emits a $Z^2$ gradient field and the imaging object is moved continuously from a +Z maximum position to a Z maximum position to achieve contiguous Z-direction coverage. The higher-order gradient coil is energized to provide a field having consistent value over an entire imaging space. The computer is further programmed to phase correct acquired MR data in a direction of imaging object movement, Fourier transform the phase corrected MR data, and reconstruct a single continuous image with MR data acquired over the desired length of the imaging object.

According, the invention also includes a method of acquiring MR images with expanded FOV that includes defining a default FOV based on characteristics of the MR scanner and defining a desired FOV that is larger than the default FOV. The method includes defining a motion axis to move an object through the MR scanner and applying a non-linear gradient field. The process also includes moving the object along the motion axis and through the non-linear gradient field and acquiring k-space data over the desired FOV to reconstruct a continuous image over the desired FOV.

Preferably, the non-linear gradient field has a quadratic dependence on a location along the motion axis. The quadratic dependence provides a local gradient field with a slope equal to that of the quadratic dependence.

The present invention has been described in terms of the preferred embodiment, and it is recognized that equivalents, alternatives, and modifications, aside from those expressly stated, are possible and within the scope of the appending claims.

What is claimed is:

1. A method of acquiring spatially encoded magnetic resonance (MR) data comprising the steps of:
    applying a gradient field having an exponential relation higher than a single order along an object direction;
    moving an object to be scanned in the object direction through the gradient field; and
    acquiring MR data as the object moves with contiguous continuity in the object direction.

2. The method of claim 1 wherein the gradient field is applied in a Z-direction and is a pulsed phase encoding gradient having a constant value such that at any given Z-location, a value of the gradient field is a linear function of the given Z-location.

3. The method of claim 2 wherein the object is moved in the Z-direction on successive TRs to acquire a full range of $k_z$ data.

4. The method of claim 1 wherein the gradient field is a pulsed $Z^2$ gradient field.

5. The method of claim 1 further comprising:
    phase correcting acquired MR data along the object direction;

Fourier transforming the phase corrected MR data; and
reconstructing an image with spatial encoding in the object direction.

6. An magnetic resonance (MR) apparatus to acquire continuous imaging of a moving object over an extended field-of-view (FOV) comprising:
 a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images, wherein at least one of the gradient coils is constructed to impart
 a higher-order gradient field;
 a table moveable along a longitudinal axis into and out of the bore of the magnet; and
 a computer programmed to:
  transmit a series of RF pulses;
  apply a higher-order gradient field between each RF pulse in the series of RF pulses; and
  move the table and acquire data.

7. The MR apparatus of claim 6 wherein the computer is further programmed to reconstruct a continuous image from the data acquired after each periodic table movement.

8. The MR apparatus of claim 6 wherein the computer is further programmed to step-wise move the table a given increment based on desired $K_z$ encoding resolution.

9. The MR apparatus of claim 6 wherein the computer is further programmed to apply a higher-order gradient of consistent value in each TR.

10. The MR apparatus of claim 6 wherein the computer is further programmed to reconstruct a seamless image of length greater than that of a default FOV for the MRI system without piecing together raw data or multiple out-images.

11. A method of acquiring magnetic resonance (MR) images with expanded FOV in a longitudinal direction of an object comprising the steps of:
 defining a direction of motion of an object to be scanned;
 arranging the object such that a longitudinal axis is positioned along the direction of motion;
 applying a non-linear gradient field in the direction of motion;
 moving the object through the applied non-linear gradient field; and
 acquiring k-space data with spatial encoding in the direction of motion.

12. The method of claim 11 wherein the higher-order gradient is a spatial $Z^2$ gradient and wherein the step of moving the object is further defined as moving the object a given distance $\Delta Z$.

13. The method of claim 12 further comprising the step of calculating $\Delta Z$ based on the higher-order spatial gradient field to provide sufficient $K_z$ encoding.

14. The method of claim 11 wherein the higher-order spatial gradient is a gradient other than a first order spatial gradient.

15. The method of claim 11 further comprising the steps of applying the higher-order spatial gradient at a same value for each TR period.

16. The method of claim 11 further comprising the steps of applying a rewinder gradient to rephase spins during each TR period, wherein the rewinder gradient is applied with a same value for each period.

17. A computer readable storage medium having a computer program stored thereon and representing a set of instructions which, when executed by a computer, cause the computer to:
 A) initiate transmission of an RF signal toward an imaging object;
 B) energize a higher-order gradient coil;
 C) enquire MR data;
 D) move the imaging object;
 E) repeat steps A–D until sufficient magnetic resonance (MR) data is acquired along a desired length of the imaging object coincident with a direction of motion; and
 F) reconstruct a contiguous image of the desired length of the object.

18. The computer readable storage medium of claim 17 wherein the higher-order gradient coil emits a $Z^2$ gradient field and the imaging object is moved continuously from a +Z maximum position to a −Z maximum position to achieve contiguous Z-direction coverage.

19. The computer readable storage medium of claim 17 wherein the higher-order gradient coil is energized to provide a field having consistent value over an entire imaging space.

20. The computer readable storage medium of claim 17 wherein the set of instructions further causes the computer to:
 phase correct acquired MR data in a direction of imaging object movement;
 Fourier transform the phase corrected MR data; and
 reconstruct a single contiguous image with MR data acquired over the desired length of the imaging object.

21. A method of acquiring magnetic resonance (MR) images with expanded field-of-view (FOV) comprising the steps of;
 defining a default FOV based on characteristics of an MR scanner;
 defining a desired FOV larger than the default FOV;
 defining a motion axis to move an object through the MR scanner;
 applying a non-linear gradient field;
 moving the object along the motion axis and through the non-linear gradient field; and
 acquiring k-space data over the desired FOV to reconstruct a contiguous image over the desired FOV.

22. The method of claim 21 wherein the non-linear gradient field has a quadratic dependence on a location along the motion axis.

23. The method of claim 22 where the quadratic dependence provides a local gradient field with a slope equal to that of the quadratic dependence.

* * * * *

UNITED STATES PATENT AND TRADEMARK OFFICE
CERTIFICATE OF CORRECTION

PATENT NO. : 6,983,181 B2
DATED : January 3, 2006
INVENTOR(S) : Hinks et al.

It is certified that error appears in the above-identified patent and that said Letters Patent is hereby corrected as shown below:

Column 9,
Line 27, delete "$K_z$" and insert -- $k_z$ --;

Column 10,
Line 12, delete "enquire" and insert -- acquire --;
Line 40, delete "of;" and insert -- of: --.

Signed and Sealed this

Fourth Day of April, 2006

JON W. DUDAS
*Director of the United States Patent and Trademark Office*